United States Patent
Vashchenko et al.

(10) Patent No.: US 7,193,251 B1
(45) Date of Patent: Mar. 20, 2007

(54) ESD PROTECTION CLUSTER AND METHOD OF PROVIDING MULTI-PORT ESD PROTECTION

(75) Inventors: Vladislav Vashchenko, Palo Alto, CA (US); Ann Concannon, San Jose, CA (US); Peter J Hopper, San Jose, CA (US); Marcel ter Beek, Pleasanton, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/339,192

(22) Filed: Jan. 9, 2003

(51) Int. Cl.
*H01L 29/74* (2006.01)

(52) U.S. Cl. ............ 257/119; 257/355; 257/107; 257/E29.215

(58) Field of Classification Search ........ 257/355–356, 257/357–360, 361–362, 107, 110, 119, E29.215; 360/328; 361/58
See application file for complete search history.

(56) References Cited

U.S. PATENT DOCUMENTS

| | | | | |
|---|---|---|---|---|
| 5,602,404 A * | 2/1997 | Chen et al. | ........ | 257/112 |
| 5,637,900 A * | 6/1997 | Ker et al. | ........ | 257/355 |
| 5,804,861 A * | 9/1998 | Leach | ........ | 257/362 |
| 5,818,088 A * | 10/1998 | Ellis | ........ | 257/355 |
| 5,856,214 A * | 1/1999 | Yu | ........ | 438/133 |
| 5,959,820 A * | 9/1999 | Ker et al. | ........ | 361/111 |
| 5,959,821 A * | 9/1999 | Voogel | ........ | 361/111 |
| 6,002,568 A * | 12/1999 | Ker et al. | ........ | 361/111 |
| 6,011,681 A * | 1/2000 | Ker et al. | ........ | 361/111 |
| 6,144,542 A * | 11/2000 | Ker et al. | ........ | 361/111 |
| 6,249,410 B1 * | 6/2001 | Ker et al. | ........ | 361/56 |
| 6,258,634 B1 * | 7/2001 | Wang et al. | ........ | 438/133 |
| 6,323,074 B1 * | 11/2001 | Jiang et al. | ........ | 438/202 |
| 6,355,959 B1 * | 3/2002 | Vashchenko et al. | ........ | 257/355 |
| 6,433,979 B1 * | 8/2002 | Yu | ........ | 361/56 |
| 6,437,407 B1 * | 8/2002 | Ker et al. | ........ | 257/357 |
| 6,456,474 B2 * | 9/2002 | Yasumori | ........ | 361/91.5 |
| 6,492,208 B1 * | 12/2002 | Cheng et al. | ........ | 438/133 |
| 6,501,632 B1 * | 12/2002 | Avery et al. | ........ | 361/111 |
| 6,507,469 B2 * | 1/2003 | Andoh | ........ | 361/56 |
| 6,521,952 B1 * | 2/2003 | Ker et al. | ........ | 257/360 |
| 6,538,266 B2 * | 3/2003 | Lee et al. | ........ | 257/173 |
| 6,541,801 B1 * | 4/2003 | Vashchenko et al. | ........ | 257/119 |
| 6,542,346 B1 * | 4/2003 | Chen et al. | ........ | 361/111 |
| 6,555,878 B2 * | 4/2003 | Song et al. | ........ | 257/355 |
| 6,559,508 B1 * | 5/2003 | Lin et al. | ........ | 257/360 |
| 6,576,934 B2 * | 6/2003 | Cheng et al. | ........ | 257/107 |
| 6,594,132 B1 * | 7/2003 | Avery | ........ | 361/111 |
| 6,614,061 B2 * | 9/2003 | Miaw | ........ | 257/173 |
| 6,617,649 B2 * | 9/2003 | Chang et al. | ........ | 257/355 |
| 6,631,061 B2 * | 10/2003 | Okawa | ........ | 361/56 |
| 6,642,088 B1 * | 11/2003 | Yu | ........ | 438/155 |
| 6,671,153 B1 * | 12/2003 | Ker et al. | ........ | 361/111 |
| 6,696,731 B2 * | 2/2004 | Mallikarjunaswamy | ........ | 257/362 |
| 6,717,219 B1 * | 4/2004 | Vashchenko et al. | ........ | 257/355 |
| 6,737,682 B1 * | 5/2004 | Yu | ........ | 257/173 |
| 6,750,515 B2 * | 6/2004 | Ker et al. | ........ | 257/357 |
| 6,756,642 B2 * | 6/2004 | Lee et al. | ........ | 257/355 |

(Continued)

*Primary Examiner*—Thao X. Le
(74) *Attorney, Agent, or Firm*—Jurgen Vollrath

(57) ABSTRACT

In multiple port chip circuit, an ESD protection circuit and method of protecting the ports of the multiple port circuit, includes providing a plurality of bi-directional snapback devices such as DIACs and connecting only one electrode to ground while connecting the other electrodes to the ports that are to be protected.

9 Claims, 6 Drawing Sheets

U.S. PATENT DOCUMENTS

| | | |
|---|---|---|
| 6,765,771 B2 * | 7/2004 | Ker et al. .................... 361/56 |
| 6,784,029 B1 * | 8/2004 | Vashchenko et al. ....... 438/129 |
| 2001/0007521 A1 * | 7/2001 | Chen ........................... 361/56 |
| 2002/0008563 A1 * | 1/2002 | Lin .............................. 327/310 |
| 2002/0017654 A1 * | 2/2002 | Lee et al. ................... 257/173 |
| 2002/0056876 A1 * | 5/2002 | Schroeder et al. .......... 257/355 |
| 2002/0089017 A1 * | 7/2002 | Lai et al. ..................... 257/355 |
| 2002/0130366 A1 * | 9/2002 | Morishita ................... 257/360 |
| 2002/0140037 A1 * | 10/2002 | Jung .......................... 257/357 |
| 2002/0145163 A1 * | 10/2002 | Pan ............................ 257/355 |
| 2003/0035257 A1 * | 2/2003 | Chen ........................... 361/56 |
| 2003/0081362 A1 * | 5/2003 | Lee et al. ..................... 361/56 |

\* cited by examiner

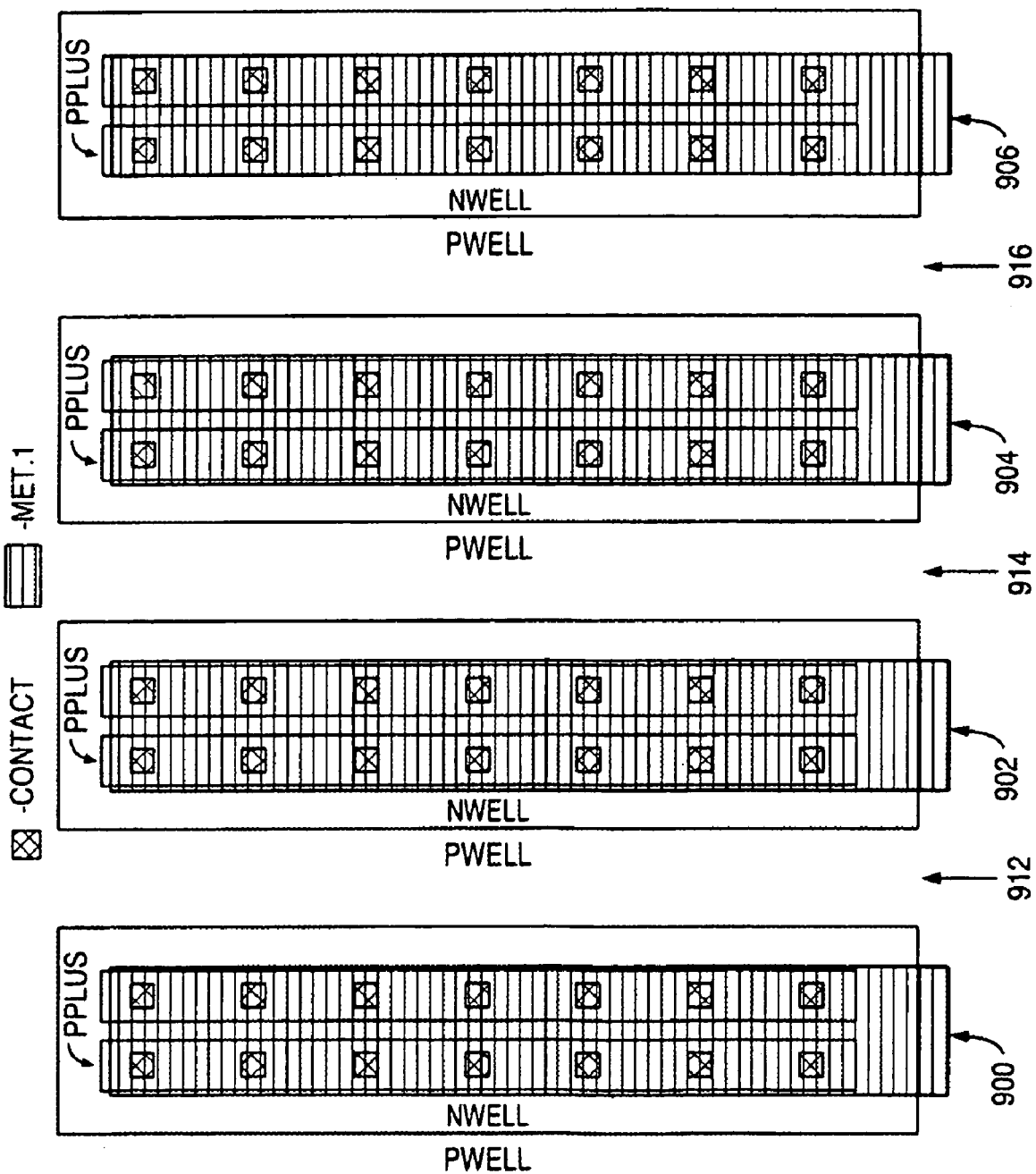

ESD PROTECTION CLUSTER AND METHOD OF PROVIDING MULTI-PORT ESD PROTECTION

FIELD OF THE INVENTION

The invention relates to an on chip electrostatic discharge (ESD) protection device. In particular, it relates to a protection device for protecting multiple pins of a semiconductor device against ESD events.

BACKGROUND OF THE INVENTION

Analog circuits typically display sensitivity to excessive voltage levels. Transients, such as electrostatic discharges (ESD) can therefore cause the voltage handling capabilities of the analog circuit to be exceeded, resulting in damage to the analog circuit. In order to protect circuits during ESD events, clamps have been devised to shunt current to ground during excessive voltage peaks.

Where multiple ports have to be protected, for instance where multiple pins of a semiconductor device have to be protected, one of two approaches is typically adopted. In the local clamp approach, as shown in FIG. 1, a separate ESD structure, each with an anode and a cathode, is used to protect each port. In the rail based approach two diodes are used to connect each pin between a power rail (power supply bus, Vdd, or ESD+rail) and a ground rail or Vss or ESD−rail, and the two buses or rails are clamped by an ESD triggering clamp.

It will be appreciated that both solutions are highly space intensive. In the local clamp approach for N ports, N additional structures have to be included. In the rail approach for N ports, 2N+1 additional structures have to be included (2N diodes and 1 triggering structure).

What is needed is an ESD solution that requires less space on the chip. The present invention provides such a solution.

SUMMARY OF THE INVENTION

The invention relates to a method of protecting multiple ports or pins of a circuit using a cluster of bi-directional snapback structures such as bi-directional thyristor devices (for example diode ac switches (DIACs) or triode ac switches (TRIACs)) in which only one port or pin of the circuit may be connected to ground while connecting the other ports or pins to other electrodes in the cluster. Preferably a DIAC is used in which the distance between the grounded electrode and any of the other electrodes preferably does not exceed 100 μm and more preferably does not exceed 70 μm, and even more preferably does not exceed 50 μm.

According to the invention, there is provided a method of protecting multiple ports of a semiconductor chip circuit, comprising providing multiple alternating n-wells and p-wells in the substrate of the chip, forming a n+region and a p+region in each of the n-wells or each of the p-wells, connecting the n+region and p+region in each said well to define an electrode, and connecting a majority of the electrodes to different ports. Preferably, the method includes connecting one electrode to ground and the other electrodes to different ports.

Further according to the invention there is provided a method of protecting multiple ports of a semiconductor chip circuit, comprising forming a series of DIACs lengthwise in series next to each other in a substrate and connecting electrodes of the DIACs to different ports of the circuit so that the at least one of the DIACs uses a discharge space that is common with at least part of the discharge space of at least one other DIAC. Typically, the majority of the electrodes are connected to different ports. Preferably one electrode is connected to ground and each of the other electrodes is connected to a different port. Preferably, the distance between the grounded electrode and any of the other electrodes does not exceed 100 μm and more preferably does not exceed 70 μm and even more preferably does not exceed 50 μm.

Further, according to the invention, there is provided a multiple port semiconductor chip circuit in which the ports are ESD protected, comprising a multiple port semiconductor circuit, multiple alternating n-wells and p-wells formed in a substrate of the semiconductor, a n+region and a p+region formed in each of the n-wells or each of the p-wells, wherein the n+region and p+region in each said well are connected to define an electrode, and more than half of the electrodes are connected to different ports. Preferably one electrode is connected to ground and the other electrodes are connected to different ports. Preferably, the distance between the grounded electrode and any of the other electrodes does not exceed 100 μm and more preferably does not exceed 70 μm and even more preferably does not exceed 50 μm.

Still further, according to the invention there is provided a multiple port semiconductor chip circuit in which the ports are ESD protected, comprising a multiple port circuit, a series of DIACs formed lengthwise in series next to each other in a substrate, wherein at least some of the electrodes of the DIACs are connected to different ports of the multiple port circuit so that at least one of the DIACs uses a discharge space that is common with at least part of the discharge space of at least one other DIAC. DIACs may also be formed laterally next to each other.

BRIEF DESCRIPTION OF THE DRAWINGS

FIG. 9 shows a plan view of one embodiment of the invention;

DETAILED DESCRIPTION OF THE INVENTION

One type of ESD protection device that exists, is a bi-directional device, which displays a snap-back characteristic under both positive and negative voltage pulses. Such ESD protection device or triggering structure for dual polarity applications therefore display an S-shaped I-V characteristic for voltage swings in both directions. Examples of such devices are bi-directional thyristor devices such as TRIACs (triode AC switches) and DIACs (diode AC switches) (for example AC trigger diodes and bi-directional p-n-p-n diode switches).

Figure 1:
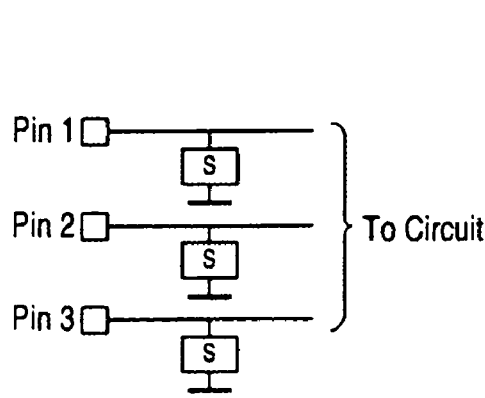
FIG. 1 is a circuit showing one conventional approach to providing ESD protection to multiple pins on a chip.
Figure 2:
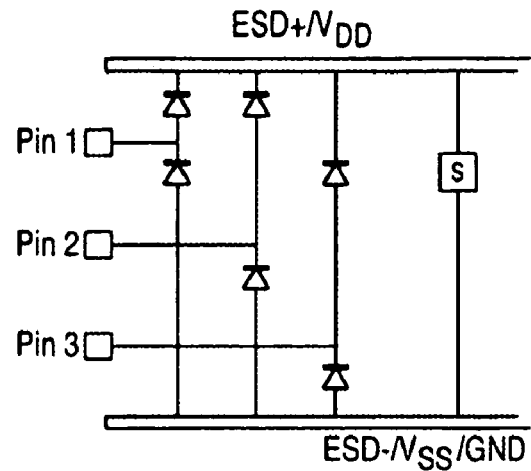
FIG. 2 is a circuit showing another conventional approach to providing ESD protection to multiple pins on a chip.
Figure 3:
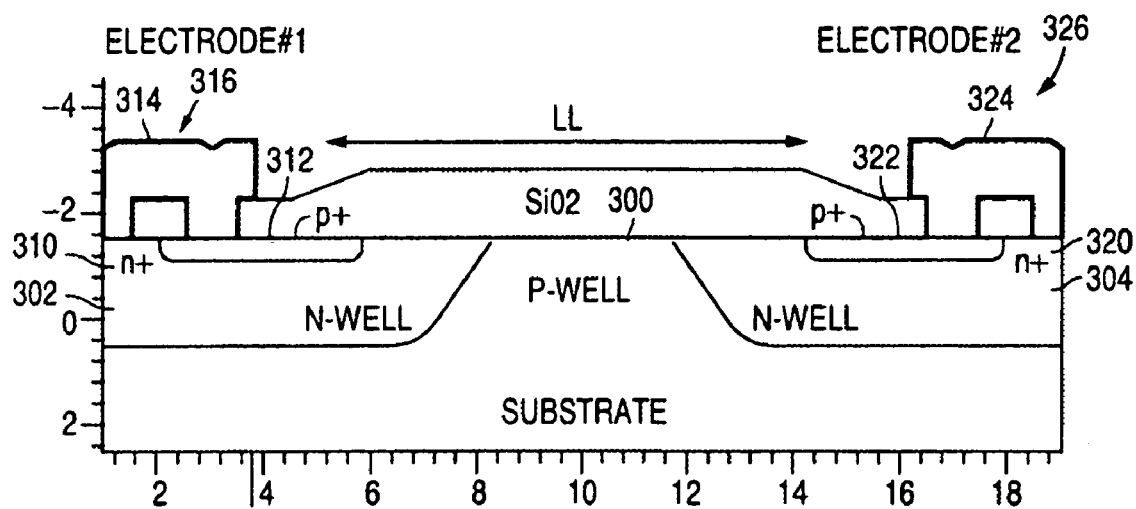
FIG. 3 is a cross-sectional view of a typical DIAC ESD protection structure.

FIG. 3 is a sectional view through a typical prior art DIAC which includes a p-well 300 separating two n-wells 302, 304. Each of the n-wells includes a n+region and a p+region. The n-well 302 includes n+region 310 and p+region 312 which are connected together by means of a contact 314 to define one electrode 316. Similarly, the n-well 304 includes n+region 320 and p+region 322 which are connected together by means of a contact 324 to define a second electrode 326.

The present invention makes use of the bi-directional characteristics of such a device to provide a new ESD protection cluster. Instead of providing a separate discharge path from each port that is to be protected, to ground, the present invention provides for the sharing of discharge paths or parts thereof. Thus a discharge may take place between a single common ground coupled electrode and any one of the other electrodes, or can take place between any two electrodes. Thus, in one instance the discharge may take place from electrode 5 to electrode 6, and another time the discharge may take place from electrode 2 to electrode 5. In the second case electrode 5 would be the low voltage electrode, while in the first case it would be the high voltage electrode.

Nevertheless, it will be appreciated that the ESD protection cluster still has to have the necessary triggering voltage irrespective of the electrodes involved in the discharge. Thus, the triggering voltage may not be too high, to avoid damage to the circuit being protected. Also, the triggering structure must not remain in conduction once the ESD pulse has passed and normal voltages resume. Thus, the holding voltage of the device must be sufficiently high to avoid latch-up during normal operation. Furthermore, in the case of integrated circuits based on BiCMOS technology it is desirable to implement the protection circuit using existing process steps.

Figure 4:
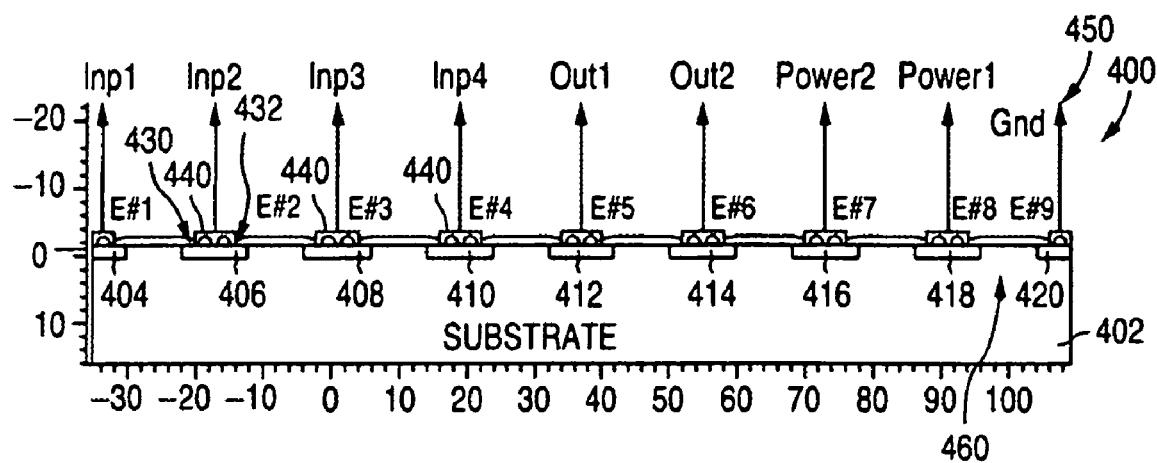
FIG. 4 is a sectional view of a DIAC structure showing one implementation of the invention.

FIG. 4 shows a cross-sectional view of one embodiment of the invention, and as will be discussed further below, it provides for low triggering while providing for a substantial space saving. The cluster 400 shown in FIG. 4 comprises a substrate 402 (in this case a p-substrate, but could instead be a n-substrate) with a plurality of wells of opposite polarity 404, 406, 408, 410, 412, 414, 416, 418, 420 (in this case n-wells) formed in the p-substrate 402 to define a plurality of n-wells separated by p-wells. As in a conventional DIAC, each of the n-wells 404–420 includes a n+region and a p+region, depicted by numerals 430 and 432, respectively for each of the n-wells. The n+regions and p+regions are connected by a common contact 440 for each n-well. However, unlike a conventional DIAC, a plurality of p-wells are defined between the various n-wells, and each of the contacts 440 defines an electrode that is connected to a different port or pin. In this case the electrode associated with n-well 404 is connected to input pin 1 (Inp1), electrode associated with n-well 403 is connected to input pin 2 (Inp2), etc. One of the electrodes (the one associated with n-well 420) is connected to the ground pin 450 (Gnd).

As mentioned above, electrostatic discharges can take place between any two electrodes. Typically, however a discharge will take place between an electrode connected to an input or output pin, and the electrode connected to ground. Thus, for instance, a discharge may take place between the electrode 452 (connected to the Power 1 pin) and the ground pin 450, thus allowing for a short discharge path through the p-well 460 between n-wells 418 and 420. On another occasion, an ESD discharge may take place between input pin 2 (Inp2) and the ground pin 450. It will be appreciated that in the latter case, the discharge path extends through numerous p-wells, including p-well 460.

Figure 5:
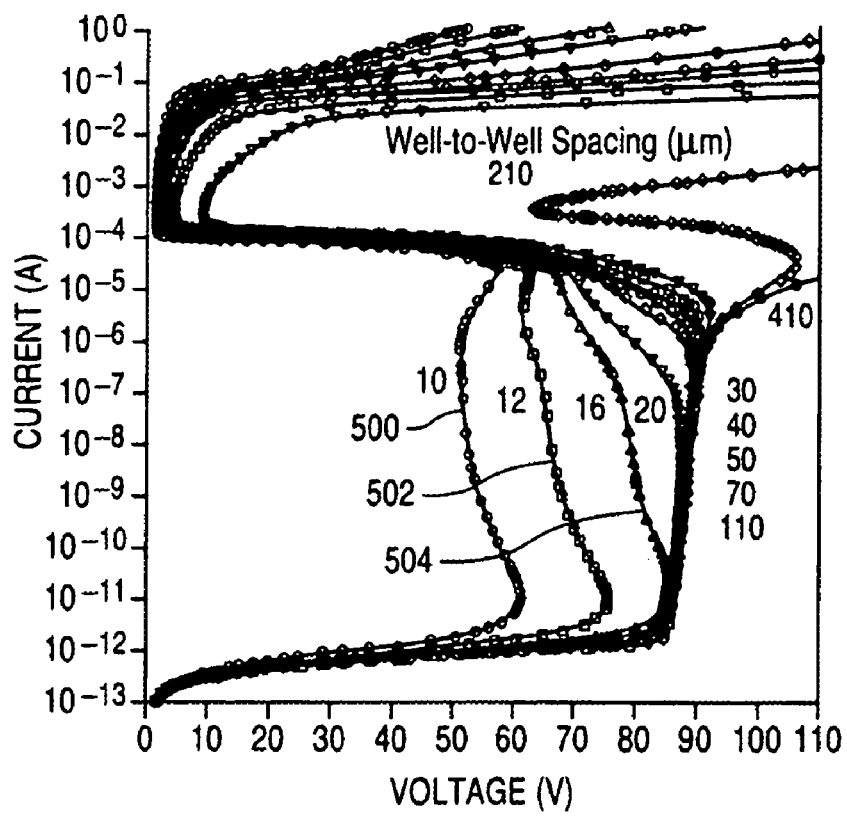
FIG. 5 shows simulated log current-voltage curves for different well-to-well spacings in a DIAC.
Figure 6:
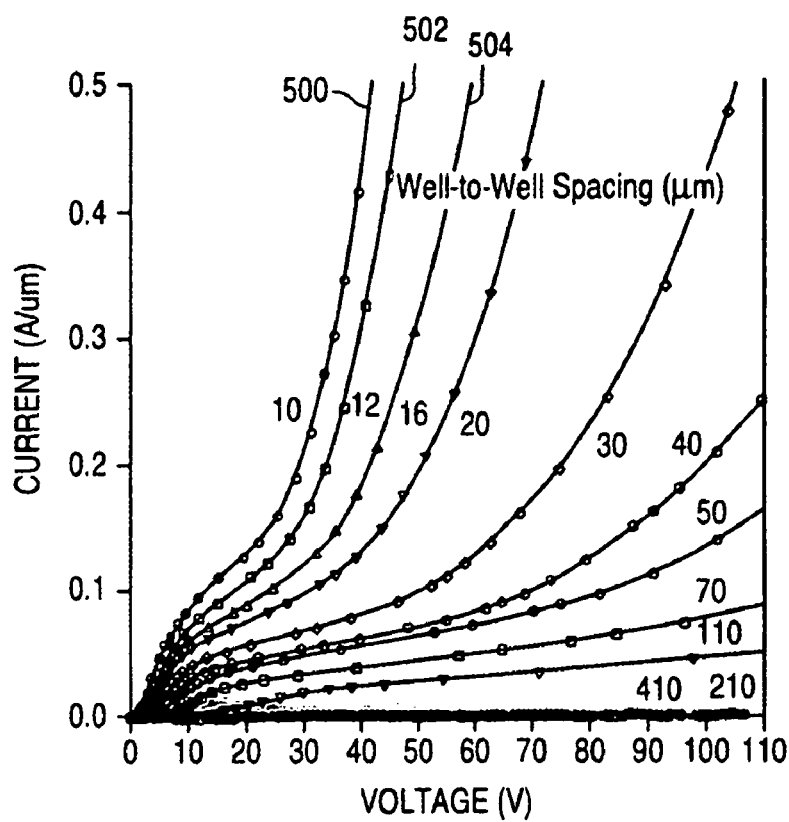
FIG. 6 shows simulated current-voltage curves for different well-to-well spacings in a DIAC.

Nevertheless, simulations have shown that the increase in the discharge path can be kept within certain limits to thereby maintain a desired triggering voltage. FIGS. 5 and 6 show current versus voltage curves based on simulations for different well to well spacings in micrometers. (FIG. 5 shows current on a log scale to clearly show the snapback effect, while FIG. 6 shows current on a linear scale). The different well spacings thus provide an indication of the effect of different length discharge paths on the I-V characteristics. As can be seen in FIG. 5, for a well spacing of 10 μm (curve 500), triggering takes place at about 60 V. When the well spacing is increased to 12 μm (curve 502), the triggering voltage goes up to about 75 V. For 16 μm (curve 504), the triggering voltage is about 85 V. However, at greater distances of 30, 40, 50, 70, 110, 210, and 410 μm (not shown) the triggering remains substantially at 85 V. As current increases above about 1 mA and especially above 1 A, however, some variation in the curves becomes apparent, even for the well-to-well spacings above 30 μm. This can best be seen on the linear scale of FIG. 6.

Figure 7:
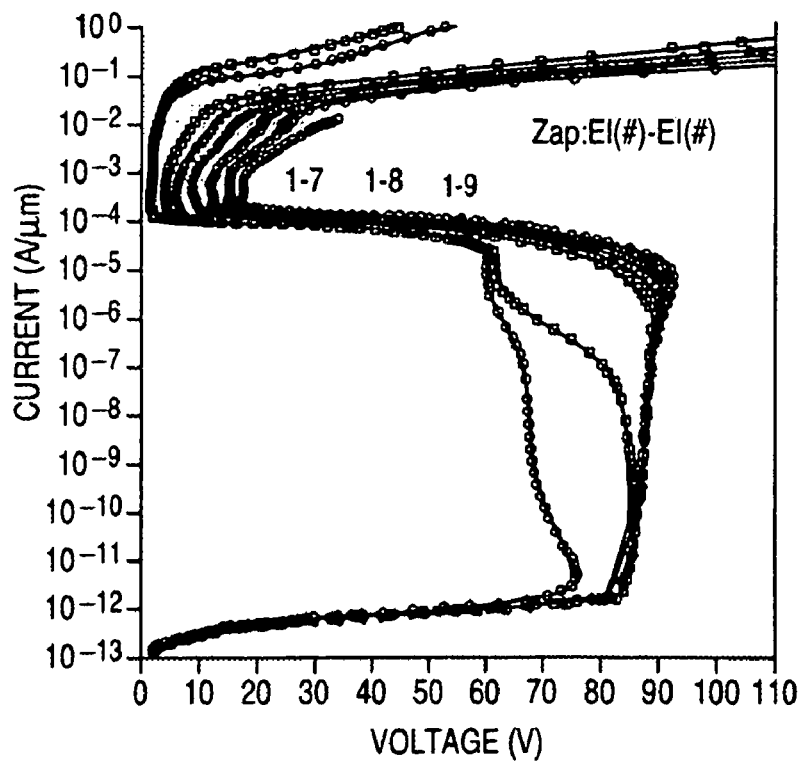
FIG. 7 shows simulated log current-voltage curves for different pairs of ports in a DIAC.
Figure 8:
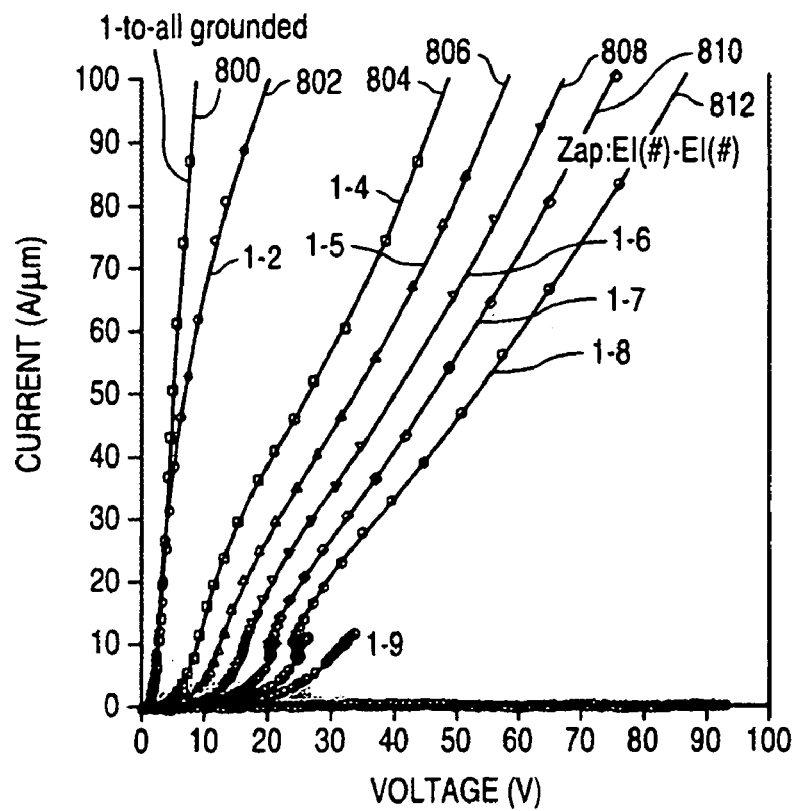
FIG. 8 shows simulated current-voltage curves for different pairs of ports in a DIAC.

Simulations were also done for discharges between a first electrode and a number of other electrodes spaced at different distances from the first electrode, namely electrodes 2, 4, 5, 6, 7, and 8. The curves are very similar to those of FIGS. 5 and 6, and are shown in FIGS. 7 and 8 and indicated in FIG. 8 by curves 802, 804, 806, 808, 810, 812, respectively.

However, while the triggering voltage remains pretty much unchanged above distances of about 16 μm, FIG. 6 shows that after triggering the I-V curves become increasingly flat, especially at distances above 100 μm and even about 70 μm. In fact the simulations results suggest that the ESD characteristics are best maintained at distances of below 50 μm.

The present invention makes use of these characteristics to provide for a clustered structure that shares discharge paths or parts of discharge paths depending on which electrodes are involved in the ESD event.

Figure 10:
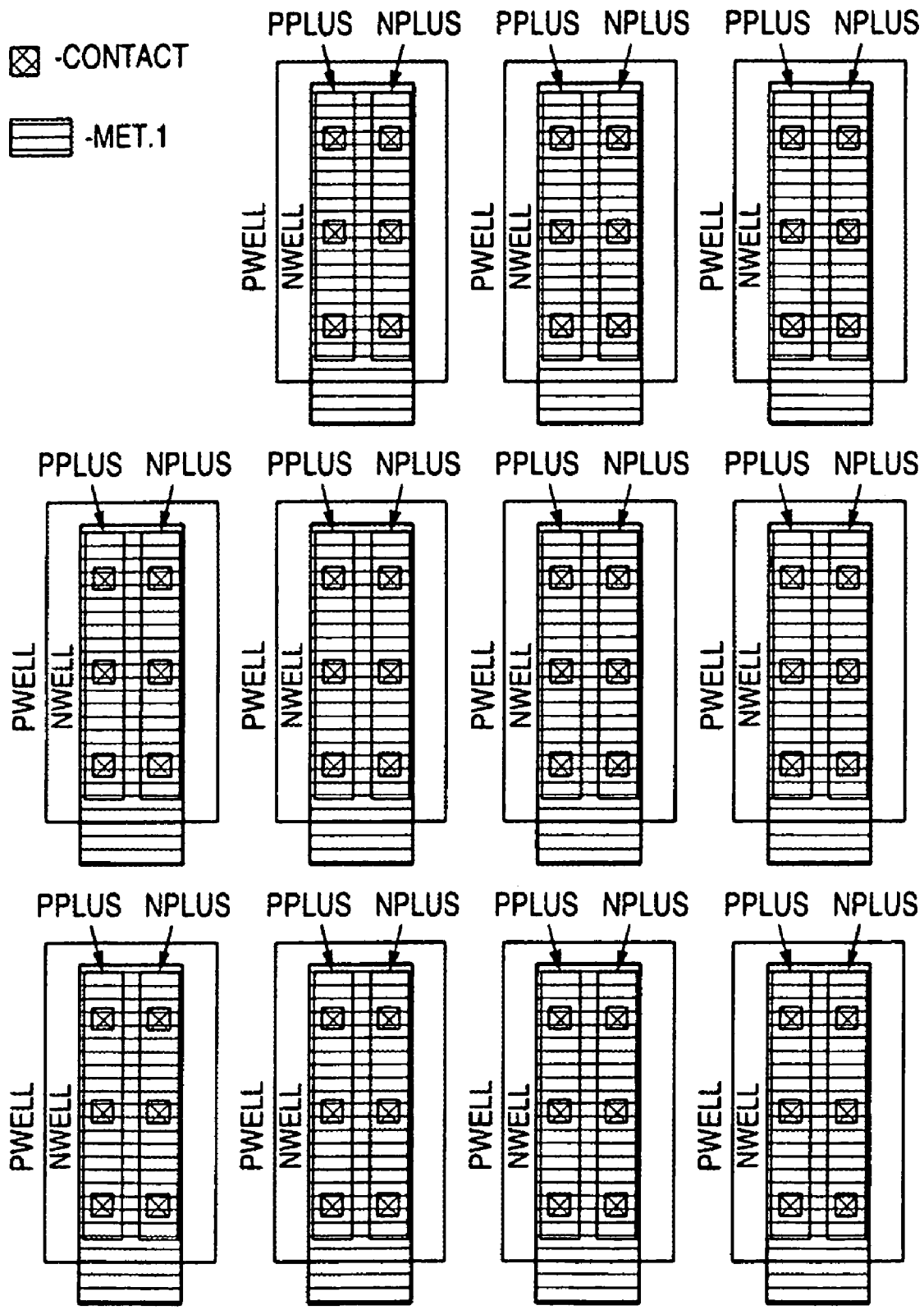
FIG. 10 shows a plan view of another embodiment of the invention.

In order to keep the discharge path as short as possible, the invention further contemplates different configurations. In the embodiment shown in FIG. 9, a plan view is shown of multiple fingers of n-wells 900, 902, 904, 906, separated by p-wells 912, 914, 916. In the embodiment of FIG. 10 the number of fingers is increased by defining a matrix of fingers as shown. By defining a plurality of fingers in the x and y directions, more ports can be served without having to create a structure where the discharge path is too long.

Figure 11:
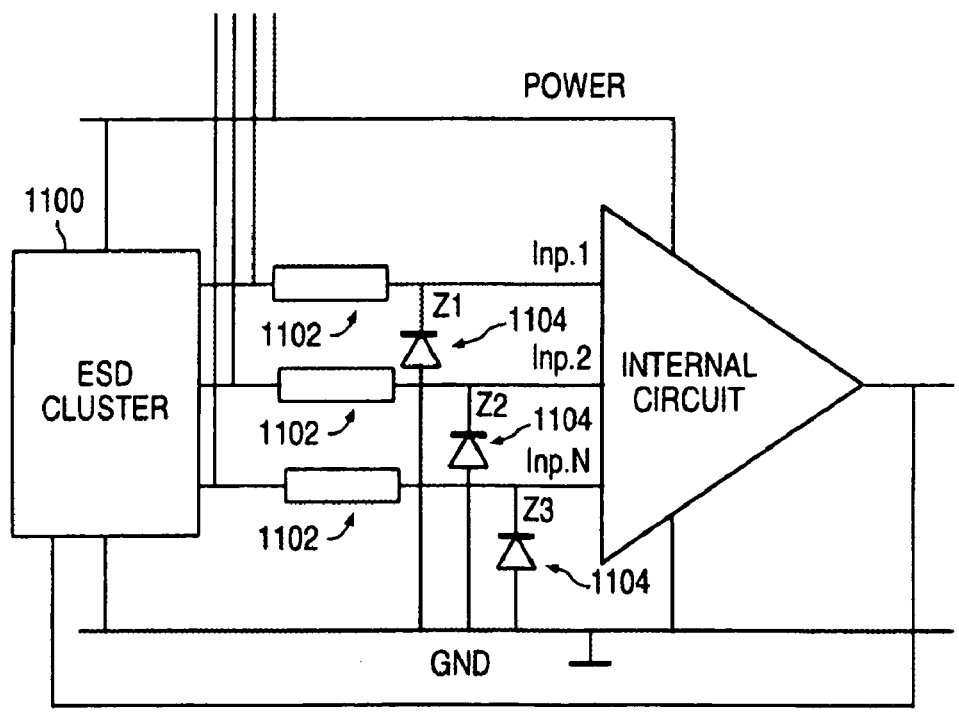
FIG. 11 shows a dual stage ESD protection circuit using the ESD structure of the invention.

The cluster of the invention can also be used for two stage ESD protection as shown in FIG. 11, in which the first stage is based on the bi-directional cluster 1100 of the invention, and the second stage comprises resistors 1102 and smaller zener diodes 1104. Two stage devices allow a rough first stage protection to be achieved which handles the ESD stress but does not necessarily fit into the operating window defined by the triggering voltage and the holding voltage. Instead, the second stage (in this case involving the resistors 1102 and zener diodes 1104) provide for a precise but smaller ESD protection for the various ports. The zener diodes 1104 are forward biased during negative polarity swings, and during positive voltage pulses, are reverse biased to trigger at the zener breakdown voltage.

While the invention has been described using DIAC structures and showed certain specific configurations, it will be appreciated that this was for illustrative purposes only and that other bi-directional structures could be used and other configurations developed without departing from the scope of the invention.

What is claimed is:

1. A multiple port semiconductor ESD protection circuit, comprising
a multiple port semiconductor circuit having at least three ESD protection ports that provide discharge paths between any of the ESD protection ports,
multiple alternating n-wells and p-wells formed in a substrate of the semiconductor ESD protection circuit, and
an n+ region and a p+ region formed in each of the n-wells or each of the p-wells but not in both the n-wells and the p-wells, wherein, for each said n-well or each said p-well having an n+ region and a p+ region, the n+ region and p+ region are electrically connected to each other to define an ESD protection port.

2. A circuit of claim 1, wherein one ESD protection port is connected to ground.

3. A circuit of claim 2, wherein the distance between the grounded port and any of the other ESD protection ports does not exceed 100 μm.

4. A circuit of claim 2, wherein the distance between the grounded port and any of the other ESD protection ports does not exceed 70 μm.

5. A circuit of claim 2, wherein the distance between the grounded port and any of the other ESD protection ports does not exceed 50 μm.

6. A multiple port semiconductor ESD protection chip circuit, comprising
a multiple port circuit having at least three ESD protection ports,
a series of n-wells and p-wells wherein either each n-well or each p-well has an n+ region and a p+ region formed in it, wherein for each said n-well or each said p-well with an n+ region and a p+ region the n+ region and the p+ region are connected to each other to define one of said ESD protection ports, the at least three ESD protection ports defining discharge spaces between them, wherein at least part of at least one of the discharge spaces overlaps at least part of another discharge space.

7. A circuit of claim 6, wherein one ESD protection port is connected to ground.

8. A circuit of claim 7, wherein the distance between the grounded ESD protection port and any of the other ESD protection ports does not exceed 100 μm.

9. A circuit of claim 7, wherein the distance between the grounded ESD protection port and any of the other ESD protection ports does not exceed 50 μm.

* * * * *